(12) United States Patent
Kobayashi et al.

(10) Patent No.: US 10,433,457 B2
(45) Date of Patent: Oct. 1, 2019

(54) COOLER AND FLOW PATH UNIT

(71) Applicants: Tomoyoshi Kobayashi, Aichi (JP); Koji Hachiya, Hyogo (JP); Eiji Shimoyama, Okayama (JP)

(72) Inventors: Tomoyoshi Kobayashi, Aichi (JP); Koji Hachiya, Hyogo (JP); Eiji Shimoyama, Okayama (JP)

(73) Assignee: OMRON CORPORATION, Kyoto (JP)

( * ) Notice: Subject to any disclaimer, the term of this patent is extended or adjusted under 35 U.S.C. 154(b) by 0 days.

(21) Appl. No.: 15/427,364

(22) Filed: Feb. 8, 2017

(65) Prior Publication Data

US 2017/0231115 A1  Aug. 10, 2017

(30) Foreign Application Priority Data

Feb. 10, 2016  (JP) ................................. 2016-023279

(51) Int. Cl.
*F28D 15/00* (2006.01)
*F28F 13/12* (2006.01)
(Continued)

(52) U.S. Cl.
CPC ......... *H05K 7/20218* (2013.01); *F28F 1/022* (2013.01); *F28F 1/025* (2013.01);
(Continued)

(58) Field of Classification Search
CPC ......... H01L 23/473; F28F 13/06; F28F 13/12; F28F 9/0265; F28F 9/0268; F28F 27/02; F28D 2021/0028; F28D 2021/0029
(Continued)

(56) References Cited

U.S. PATENT DOCUMENTS 5,361,828 A * 11/1994 Lee .................. F01D 5/187
165/109.1
6,627,040 B1  9/2003 Elsner et al.
(Continued)

FOREIGN PATENT DOCUMENTS

JP    H01-063967 U    4/1989
JP    H8-116189 A     5/1996
(Continued)

OTHER PUBLICATIONS

Office Action issued in corresponding Japanese Application No. 2016-023279, dated May 7, 2019 (6 pages).

*Primary Examiner* — Jason N Thompson
(74) *Attorney, Agent, or Firm* — Osha Liang LLP

(57) ABSTRACT

A cooler includes: a narrow flow path that has a narrow cross-sectional area; a wide flow path that is connected to a downstream side of the narrow flow path, is in thermal contact with a heating body, and has a wide cross-sectional area; and at least one rectifying piece that is provided in an upstream portion of the wide flow path that is an upstream side from a position being in thermal contact with the heating body. A fluid refrigerant flows through the narrow flow path and the wide flow path, and heat generated by the heating body is radiated. The rectifying piece includes: a single first angle portion that protrudes toward the upstream side; and a first surface and a second surface that join at an acute angle to form the first angle portion.

5 Claims, 11 Drawing Sheets

(51) Int. Cl.
  *F28F 7/00* (2006.01)
  *H05K 7/20* (2006.01)
  *F28F 1/02* (2006.01)
  *F28F 1/40* (2006.01)
  *F28F 3/12* (2006.01)
  *F28F 9/02* (2006.01)
  *H01L 23/473* (2006.01)
  *F28F 9/22* (2006.01)
  *F28D 21/00* (2006.01)

(52) U.S. Cl.
  CPC ............... *F28F 1/40* (2013.01); *F28F 3/12* (2013.01); *F28F 9/0268* (2013.01); *H01L 23/473* (2013.01); *H05K 7/20254* (2013.01); *F28D 2021/0029* (2013.01); *F28F 2009/228* (2013.01)

(58) Field of Classification Search
  USPC ............................... 165/104.33, 109.1, 80.4
  See application file for complete search history.

(56) References Cited

U.S. PATENT DOCUMENTS

| | | | | |
|---|---|---|---|---|
| 2003/0155106 A1* | 8/2003 | Malone | ............... | F28F 3/02 165/121 |
| 2009/0114372 A1* | 5/2009 | Ippoushi | ............... | F28F 3/022 165/104.14 |
| 2009/0236083 A1* | 9/2009 | Brand | ............... | F28F 3/048 165/133 |
| 2010/0302730 A1* | 12/2010 | Hernon | ............... | F28F 13/12 361/694 |
| 2012/0012284 A1* | 1/2012 | Salamon | ............... | F28F 3/048 165/109.1 |
| 2012/0097366 A1* | 4/2012 | Chen | ............... | F28F 3/12 165/96 |
| 2014/0090809 A1 | 4/2014 | Mori et al. | | |
| 2016/0029516 A1* | 1/2016 | Sever | ............... | F28F 3/022 165/80.3 |
| 2018/0115031 A1* | 4/2018 | Lee | ............... | H01M 10/613 |

FOREIGN PATENT DOCUMENTS

| | | |
|---|---|---|
| JP | 2002-512266 A | 4/2002 |
| JP | 2006-336902 A | 12/2006 |
| JP | 2014-20115 A | 2/2014 |
| JP | 2014-72395 A | 4/2014 |
| JP | 2014-107119 A | 6/2014 |
| WO | 2015/177909 A1 | 11/2015 |

* cited by examiner

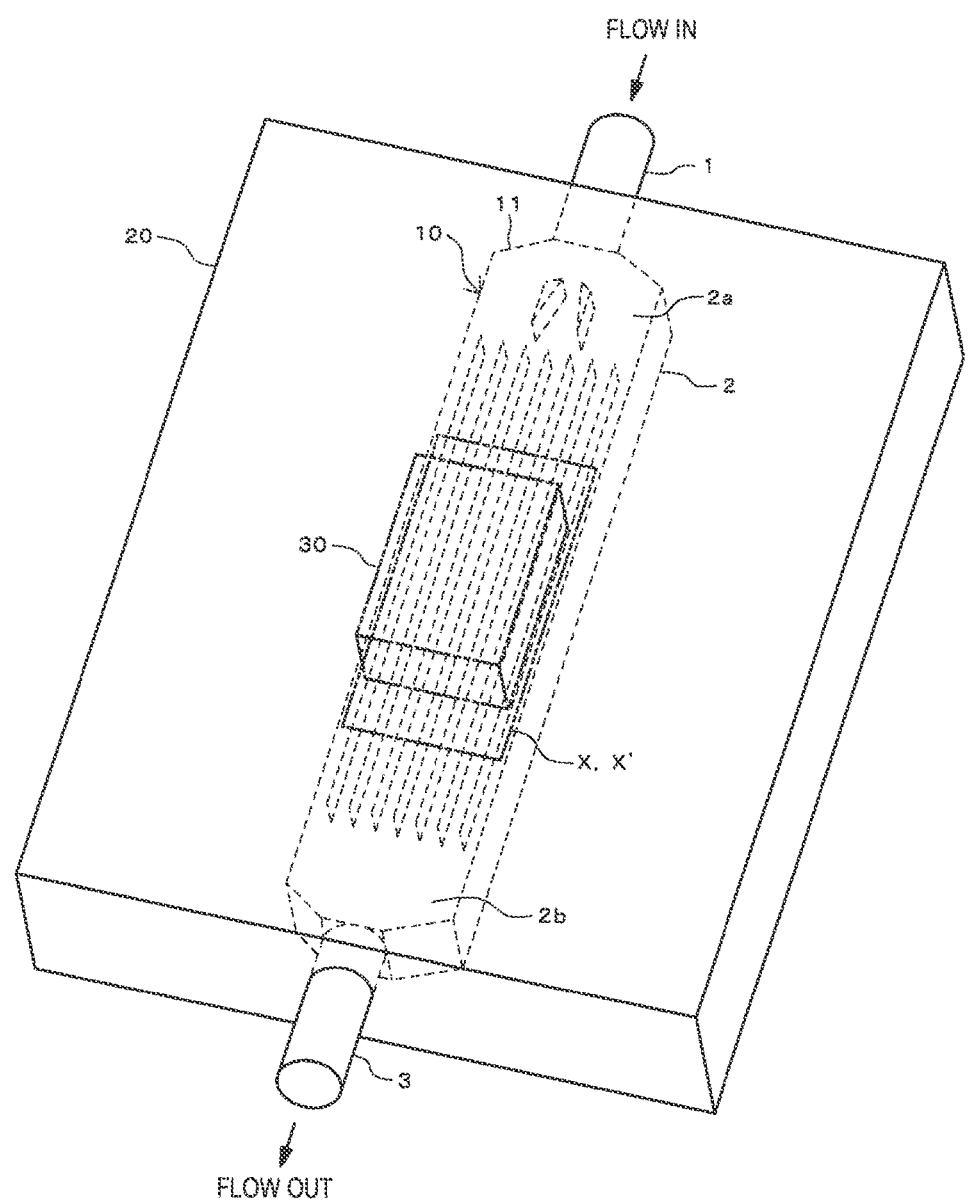

COOLER AND FLOW PATH UNIT

CROSS-REFERENCES TO RELATED APPLICATIONS

This application is based upon and claims the benefit of priority from Japanese Patent Application No. 2016-023279, filed on Feb. 10, 2016, the entire contents of which are incorporated herein by reference.

FIELD

One or more embodiments of the present invention relate to a cooler for radiating heat generated in a heating body by causing a refrigerant to flow through a flow path being in thermal contact with the heating body, and a flow path unit that includes a narrow flow path having a narrow cross-sectional area and a wide flow path having a wide cross-sectional area.

BACKGROUND

In order to radiate heat generated in a heating body such as an electronic component, there is a cooler in which a refrigerant of a fluid such as cooling water flows through a flow path which is in thermal contact with the heating body. In such a cooler, in order to improve a cooling efficiency, for example, in JP-A-2014-107119, JP-A-8-116189, JP-A-2014-20115, and JP-A-2014-72395, a plurality of ribs or fins are provided within a flow path and the flow path is divided.

In JP-A-2014-107119, the plurality of ribs are provided within the flow path in parallel or oblique to a flow direction of the refrigerant. In JP-A-8-116189, in order to agitate the cooling water within the flow path, a narrow flow path having a narrow cross-sectional area and a wide flow path having a wide cross-sectional area are alternately disposed and the plurality of fins are provided within each flow path in parallel or oblique to the flow direction of the refrigerant. In JP-A-2014-20115, in order to promote a turbulent flow of the refrigerant within the wide flow path being in thermal contact with the heating body, a plurality of corrugated fins are respectively provided within the wide flow path at predetermined intervals in the flow direction of the refrigerant and in a width direction of the flow path. In JP-A-2014-72395, a plurality of columnar fins are disposed within the wide flow path being in thermal contact with the heating body in a staggered manner and a plurality of protrusions are provided on an inner surface of the wide flow path at predetermined intervals in the flow direction of the refrigerant.

Conventionally, for example, in order to improve the cooling efficiency, a cross-sectional area of the flow path portion being in thermal contact with the heating body is wider than a cross-sectional area of other flow path portions such as inlet and outlet ports of the refrigerant that is a fluid. However, in a case where the refrigerant flows from the narrow flow path having the narrow cross-sectional area to the wide flow path having the wide cross-sectional area, the refrigerant flows through a part of the wide flow path and the refrigerant may not widely spread to the wide flow path. In addition, in the wide flow path, a difference occurs in a flow speed of the refrigerant between a certain portion and the other portions, and a vortex flow or a reverse flow of the refrigerant occurs. Therefore, a pressure loss of the refrigerant increases and the refrigerant flow in the flow direction may be stagnant. Furthermore, as in the related art, even in a case where the turbulent flow of the refrigerant is promoted by the plurality of ribs or fins in the wide flow path, the refrigerant flow in the flow direction may be stagnant. As described above, if the refrigerant flowing from the narrow flow path does not widely spread to the wide flow path, or the refrigerant flow from the narrow flow path to the wide flow path is stagnant, the cooling efficiency of the heating body by the refrigerant flowing through the wide flow path decreases.

SUMMARY

An object of one or more embodiments of the invention is to provide a cooler and a flow path unit in which a fluid can widely spread within a wide flow path, occurrence of a vortex flow, a reverse flow, or the like is suppressed, and thereby the fluid can smoothly flow.

A cooler according to one or more embodiments of the invention includes a narrow flow path that has a narrow cross-sectional area; and a wide flow path that is connected to a downstream side of the narrow flow path, is in thermal contact with a heating body, and has a wide cross-sectional area. A fluid refrigerant flows through the narrow flow path and the wide flow path, and heat generated by the heating body is radiated. The cooler includes at least one rectifying piece, which is provided in an upstream portion of the wide flow path that is on an upstream side from a position being in thermal contact with the heating body. The rectifying piece includes a single first angle portion that protrudes toward the upstream side, and a first surface and a second surface that join at an acute angle to form the first angle portion.

According to the cooler, the refrigerant flowing through the narrow flow path is divided into the first surface side and the second surface side from the first angle portion of the rectifying piece, and flows through the wide flow path. Therefore, the refrigerant can widely spread to the wide flow path. While, since the refrigerant flows by becoming a laminar flow by the rectifying piece, it is possible to prevent the refrigerant from being a vortex flow, a reverse flow, or a turbulent flow, and to cause the refrigerant to smoothly flow through the wide flow path. As a result, it is possible to efficiently cool heat, which is generated by the heating body in thermal contact with the wide flow path, by the refrigerant flowing through the wide flow path.

In one or more embodiments of the invention, in the cooler, the second surface of the rectifying piece may be disposed on a broadening direction side of the wide flow path with respect to the narrow flow path as compared with the first surface. On a downstream side from the first angle portion, the first surface may be inclined at an acute angle or parallel to a center axis of the wide flow path, the second surface may be inclined at an acute angle with respect to the center axis of the wide flow path, and an angle of the second surface with respect to the center axis of the wide flow path may be greater than an angle of the first surface with respect to the center axis of the wide flow path.

In addition, in one or more embodiments of the invention, the cooler may further include a connecting surface that connects the narrow flow path and the wide flow path. The connecting surface may be inclined at an acute angle or perpendicular to the center axis of the wide flow path on the downstream side from the narrow flow path. An angle of the second surface with respect to the center axis of the wide flow path on the downstream side from the first angle portion of the rectifying piece may be equal to or less than an angle of the connecting surface with respect to the center axis of the wide flow path on the downstream side from the narrow flow path.

In addition, in one or more embodiments of the invention, in the cooler, the narrow flow path, the wide flow path and the connecting surface may be symmetrically provided with respect to the center axis of the narrow flow path and the wide flow path. A plurality of the rectifying pieces may be provided symmetrically and at predetermined intervals with respect to the center axis of the narrow flow path and the wide flow path.

In addition, in one or more embodiments of the invention, in the cooler, the first surface and the second surface of each of the rectifying pieces may be inclined so as to separate from the center axis of the wide flow path toward the downstream side.

In addition, in one or more embodiments of the invention, in the cooler, the rectifying piece may further include a third surface that is joined to the first surface and the second surface, and does not connect to the first angle portion, a second angle portion that is formed by the second surface and the third surface which join at an obtuse angle, and a third angle portion that is formed by the third surface and the first surface which join at an acute angle.

In addition, in one or more embodiments of the invention, in the cooler, a cross-sectional shape perpendicular to the center axis of the wide flow path may be rectangular. The rectifying piece may be provided to have a columnar shape in the upstream portion of the wide flow path.

Furthermore, in one or more embodiments of the invention, the cooler may further include at least one fin that is provided in a position of the wide flow path facing the heating body.

In addition, a flow path unit according to one or more embodiments of the invention includes a narrow flow path that has a narrow cross-sectional area; and a wide flow path that is connected to a downstream side of the narrow flow path and has a wide cross-sectional area. A fluid flows from the narrow flow path to the wide flow path. Therefore, the flow path unit further includes at least one rectifying piece that is provided in an upstream portion of the wide flow path; and at least one fin that is provided on a downstream side from the rectifying piece of the wide flow path. The rectifying piece includes a single first angle portion that protrudes toward the upstream side, and a first surface and a second surface that join at an acute angle to form the first angle portion.

According to the flow path unit, the fluid flowing through the narrow flow path is divided into the first surface side and the second surface side from the first angle portion of the rectifying piece, and flows through the wide flow path. Therefore, the fluid can widely spread to the wide flow path. While, since the fluid flows by being a laminar flow by the rectifying piece, it is possible to prevent the fluid from being a vortex flow, a reverse flow, or a turbulent flow, and to cause the fluid to smoothly flow through the wide flow path.

According to one or more embodiments of the invention, it is possible to cause the fluid to widely spread within the wide flow path and to cause the fluid to smoothly flow by suppressing occurrence of a vortex flow, a reverse flow, or the like.

BRIEF DESCRIPTION OF THE DRAWINGS

FIG. 2 is a view illustrating an example of use of the cooler of FIGS. 1A to 1E.

DETAILED DESCRIPTION

Figure 1A:
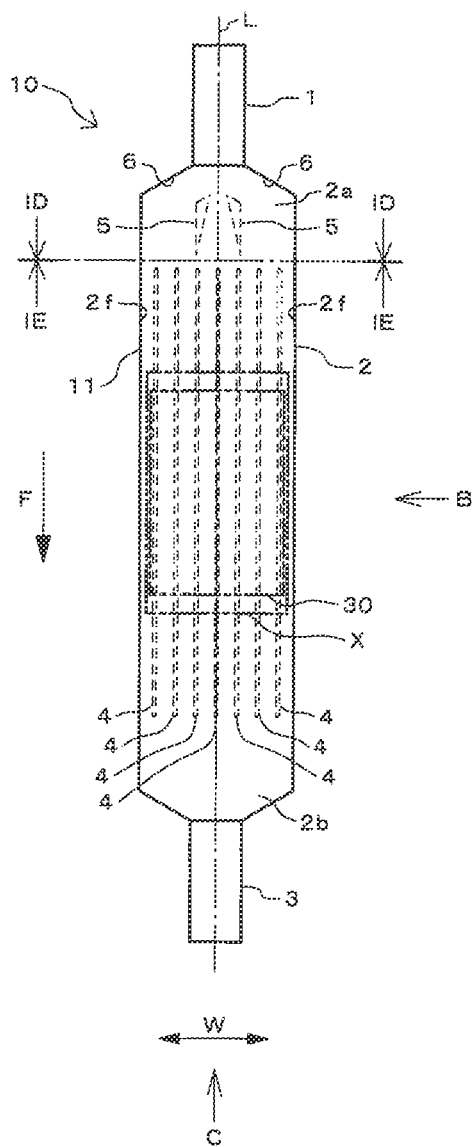
FIGS. 1A to 1E are views illustrating a cooler according to an embodiment of the invention.

In embodiments of the invention, numerous specific details are set forth in order to provide a thorough understanding of the invention. However, it will be apparent to one of ordinary skill in the art that the invention may be practiced without these specific details. In other instances, well-known features have not been described in detail to avoid obscuring the invention.

Hereinafter, embodiments of the invention will be described with reference to the drawings. The same reference numerals are given to the same portions or corresponding portions in each drawing.

Figure 1B:
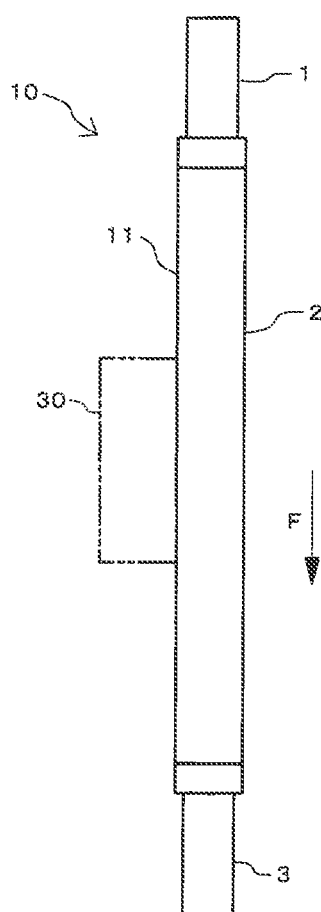
Figure 1C:
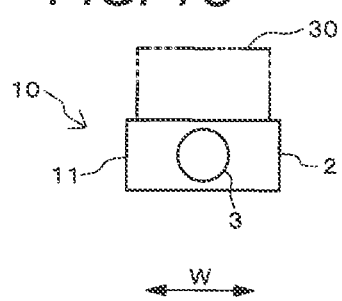
Figure 1D:
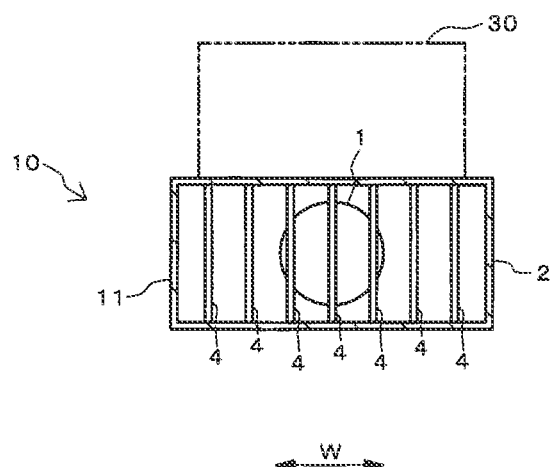
Figure 1E:
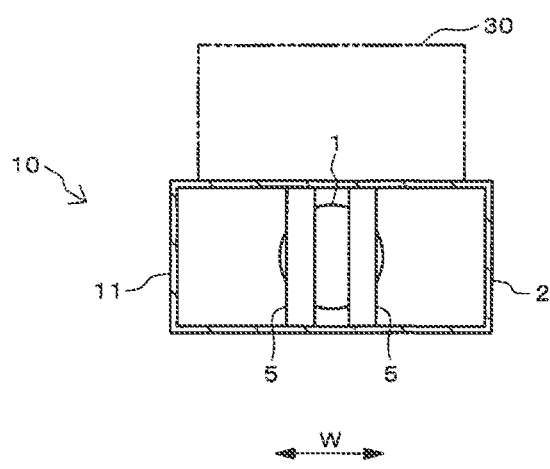

FIGS. 1A to 1E are views illustrating a cooler 10 according to an embodiment of the invention. FIG. 1A illustrates a view of the cooler 10 viewed from above, FIG. 1B illustrates a view that is taken from a direction of arrow B of FIG. 1A, and FIG. 1C illustrates a view that is taken from a direction of arrow C of FIG. 1A. FIG. 1D illustrates an enlarged cross-sectional view that is taken along line ID-ID of FIG. 1A and FIG. 1E illustrates an enlarged cross-sectional view that is taken along line IE-IE of FIG. 1A.

The cooler 10 includes a pipe 11 that is formed of, for example, a metal such as aluminum. The pipe 11 is provided with narrow flow paths 1 and 3 having a narrow cross-sectional area, and a wide flow path 2 having a wide cross-sectional area. The cooler 10 is an example of a "flow path unit" of one or more embodiments of the invention.

Among the narrow flow paths 1 and 3, one narrow flow path 1 configures an inlet port of a refrigerant that is a fluid and the other narrow flow path 3 configures an outlet port of the refrigerant that is the fluid. As the refrigerant, for example, cooling water is used. A cross-sectional shape of each of the narrow flow paths 1 and 3 with respect to a center axis L is circular (FIGS. 1C, 1D, and 1E).

As illustrated in FIGS. 1A and 1B, the wide flow path 2 is provided between the narrow flow path 1 and the narrow flow path 3. Specifically, an upstream portion 2a of the wide flow path 2 is connected to a downstream side of the narrow flow path 1 and a downstream portion 2b of the wide flow path 2 is connected to an upstream side of the narrow flow path 3.

The center axis L of the wide flow path 2 and the center axis L of the narrow flow paths 1 and 3 coincide (FIG. 1A).

As illustrated in FIGS. 1D and 1E, a cross-sectional shape of the wide flow path 2 perpendicular to the center axis L is rectangular.

FIG. 2 is a view illustrating an example of use of the cooler 10. For example, as illustrated in FIG. 2, the cooler 10 is embedded in a chassis 20 of an electronic device. In order to allow the refrigerant to flow into and out of the cooler 10, an upstream end of the narrow flow path 1 and a downstream end of the narrow flow path 3 protrude from the chassis 20.

A heating body 30 is mounted on a position X' facing the wide flow path 2 on the chassis 20. Therefore, the heating body 30 is in thermal contact with one outside portion of the pipe 11 configuring the wide flow path 2 (also see FIGS. 1A to 1E). The heating body 30 is configured of an electronic component that is heated, for example, by causing a current to flow.

The refrigerant flows from a supply source (not illustrated) into the narrow flow path 1 of the cooler 10 and the refrigerant flows from the narrow flow path 3 to a supply destination via the wide flow path 2. Therefore, the refrigerant flows through the flow paths 1 to 3 and thereby heat generated by the heating body 30 is radiated and the heating body 30 is cooled.

Figure 3:
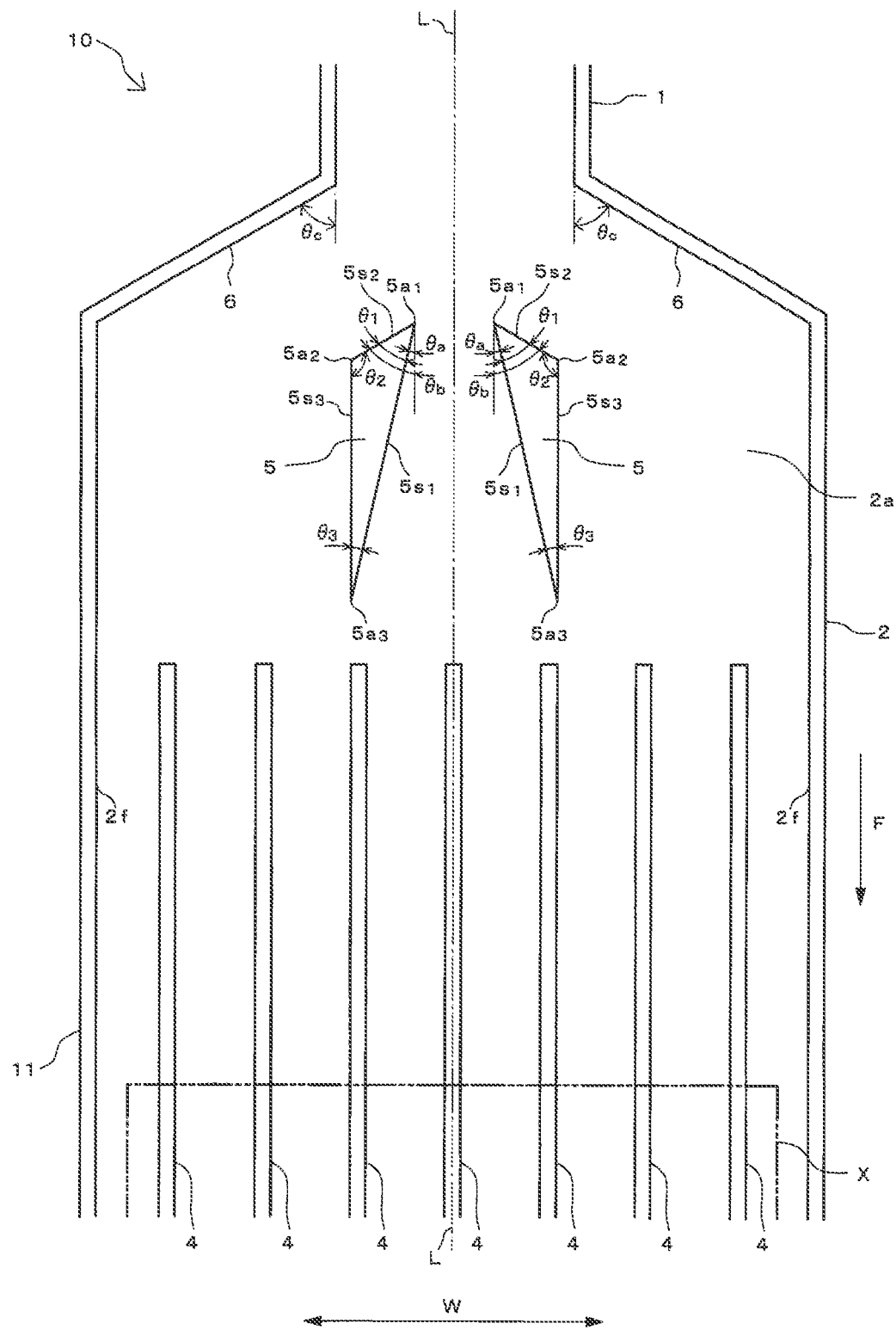
FIG. 3 is a view illustrating a main portion of the cooler of FIGS. 1A to 1E.

FIG. 3 is a view illustrating a main portion of the cooler 10. Specifically, FIG. 3 illustrates a state of insides of the narrow flow path 1 and the wide flow path 2 on the upstream side viewed from above. Moreover, in FIG. 3, hatching of a cross section portion is omitted (also the same applies to FIGS. 6 to 8).

As illustrated in FIG. 3, a plurality of fins 4 are provided in a position X of the wide flow path 2 facing the heating body 30. As illustrated in FIG. 1D, each fin 4 is provided in a columnar shape so as to connect to a top surface and a bottom surface of the wide flow path 2.

In addition, in order not to disturb the flow of the refrigerant in a flow direction F, as illustrated in FIG. 3, each fin 4 is plate-like parallel to the flow direction F of the refrigerant and the fins 4 are provided at predetermined intervals in a lateral width direction W of the wide flow path 2 perpendicular to the flow direction F. Furthermore, each fin 4 is formed so as to extend to the upstream side and the downstream side from the position X of the wide flow path 2. Heat generated by the heating body 30 being in thermal contact with the position X of the wide flow path 2 is transmitted to the refrigerant flowing through the wide flow path 2 by the fins 4.

The upstream portion 2a of the wide flow path 2 is on an upstream side from the position X being in thermal contact with the heating body 30. A plurality of rectifying pieces 5 are provided within the upstream portion 2a. As illustrated in FIG. 1E, each rectifying piece 5 is provided in a columnar shape so as to connect to the top surface and the bottom surface of the wide flow path 2.

In addition, a connecting surface 6 connecting to the narrow flow path 1 and the wide flow path 2 is provided in the upstream portion 2a of the wide flow path 2. The flow paths 1 to 3 and the connecting surface 6 are provided horizontally symmetrical with respect to the center axis L of the flow paths 1 to 3. The plurality (two) of rectifying pieces 5 are provided horizontally symmetrical with respect to the center axis L of the flow paths 1 to 3 and at predetermined intervals in the width direction W.

Each rectifying piece 5 is formed in a triangular prism shape and, as illustrated in FIG. 3, includes three angle portions $5a_1$, $5a_2$, and $5a_3$ protruding in a horizontal plane, and three surface $5s_1$, $5s_2$, and $5s_3$ that are perpendicular (perpendicular to a paper surface).

Among them, a first angle portion $5a_1$ singularly protrudes toward the upstream (anti-F direction side). A first surface $5s_1$ and a second surface $5s_2$ form the first angle portion $5a_1$ by joining at an acute angle $\theta_1$. That is, an angle of the first angle portion $5a_1$ is the acute angle $\theta_1$.

The first surface $5s_1$ and the second surface $5s_2$ are separated from the center axis L of the wide flow path 2. In addition, the first surface $5s_1$ and the second surface $5s_2$ is inclined so as to be separated from the center axis L going to the downstream side (direction F side).

The second surface $5s_2$ is disposed on a broadening direction side (side opposite to the center axis L in the width direction W) of the wide flow path 2 with respect to the narrow flow path 1 from the first surface $5s_1$. On the downstream side from the first angle portion $5a_1$, the first surface $5s_2$ is inclined at an acute angle $\theta_a$ with respect to the center axis L and the second surface $5s_2$ is inclined at an acute angle $\theta_b$ with respect to the center axis L. The angle $\theta_b$ of the second surface $5s_2$ with respect to the center axis L is greater than the angle $\theta_a$ of the first surface $5s_1$ with respect to the center axis L ($90° > \theta_b > \theta_a > 0°$).

The connecting surface 6 facing the second surface $5s_2$ is inclined at an acute angle $\theta_c$ with respect to the center axis L of the wide flow path 2 on the downstream side from the narrow flow path 1. The angle $\theta_b$ of the second surface $5s_2$ with respect to the center axis L is equal to or less than the angle $\theta_c$ of the connecting surface 6 with respect to the center axis L ($90 > \theta_c > \theta_b > \theta_a > 0°$).

A third surface $5s_3$ of the rectifying piece 5 is joined to the first surface $5s_1$ and the second surface $5s_2$, and does not contact with the first angle portion $5a_1$. The third surface $5s_3$ is parallel to the center axis L of the wide flow path 2 and a side wall 2f of the wide flow path 2.

The second surface $5s_2$ and the third surface $5s_3$ join at an obtuse angle $\theta_2$ and thereby a second angle portion $5a_2$ is formed. The third surface $5s_3$ and the first surface $5s_1$ join at the acute angle $\theta_3$ and thereby a third angle portion $5a_3$ is formed. That is, the angle of the second angle portion $5a_2$ is the obtuse angle $\theta_2$ and the angle of the third angle portion $5a_3$ is the acute angle $\theta3$.

According to the embodiment, the rectifying pieces 5 are provided in the upstream portion 2a of the wide flow path 2 of the cooler 10, and the rectifying piece 5 includes the first angle portion $5a_1$ protruding toward the upstream side at the acute angle $\theta_1$, and the first surface $5s_1$ and the second surface $5s_2$ forming the first angle portion $5a_1$ by joining each other. Therefore, when the refrigerant flowing into the narrow flow path 1 of the cooler 10 flows through the upstream portion 2a of the wide flow path 2 from the narrow flow path 1, the refrigerant flows from the first angle portion $5a_1$ of the rectifying piece 5 to the wide flow path 2 by being divided into the first surface $5s_1$ side and the second surface $5s_2$ side. That is, the refrigerant can widely spread not only to the center but also to the both end portions of the wide flow path 2 in the width direction W. While, since the refrigerant flows by being a laminar flow by the rectifying piece 5, it is possible to prevent the fluid from being a vortex flow, a reverse flow, or a turbulent flow, and to cause the fluid to smoothly flow through the wide flow path 2. As a result, it is possible to efficiently cool heat, which is generated by the heating body 30 by being in thermal contact with the wide flow path 2, by the refrigerant flowing through the wide flow path 2.

In addition, in the embodiment, the second surface $5s_2$ of the rectifying piece 5 is disposed on the broadening direction side of the wide flow path 2 with respect to the narrow flow path 1 from the first surface $5s_1$. Therefore, on the downstream side from the first angle portion $5a_1$, the first surface $5s_1$ and the second surface $5s_2$ are inclined at the acute angles $\theta_a$ and $\theta_b$ with respect to the center axis L of the wide flow path 2, and the angle $\theta_b$ of the second surface $5s_2$ is greater than the angle $\theta_a$ of the first surface $5s_1$. Therefore, the refrigerant flowing from the narrow flow path 1 can easily spread to the center and to the both end portions of the wide flow path 2 in the width direction W along the first surface $5s_1$ and the second surface $5s_2$ of the rectifying piece 5.

In addition, in the embodiment, the connecting surface 6 connecting the narrow flow path 1 and the wide flow path 2 is inclined at an acute angle $\theta_c$ with respect to the center axis L of the wide flow path 2 on the downstream side from the narrow flow path 1. Therefore, the angle $\theta_b$ of the second surface $5s_2$ with respect to the center axis L of the wide flow path 2 is equal to or less than the angle $\theta_c$ of the connecting surface 6 with respect to the center axis L of the wide flow path 2. Thus, the refrigerant flowing from the narrow flow path 1 can be smoothly and easily flows to the both end portions of the wide flow path 2 in the width direction W through a space between the second surface $5s_2$ of the rectifying piece 5 and the connecting surface 6.

In addition, in the embodiment, the flow paths 1 to 3 and the connecting surface 6 are symmetrically provided with respect to the center axis L of the flow paths 1 to 3. Furthermore, the plurality of rectifying pieces 5 are provided symmetrically and at predetermined intervals with respect to the center axis L of the flow paths 1 to 3. Therefore, the refrigerant flowing from the narrow flow path 1 smoothly and easily flows to the center of the wide flow path 2 through a space between the rectifying pieces 5, and can smoothly and easily flow to the both end portions of the wide flow path 2 in the width direction W through the space between the rectifying piece 5 and the connecting surface 6.

In addition, in the embodiment, the first surface $5s_1$ and the second surface $5s_2$ of each rectifying piece 5 are inclined so as to be separated from the center axis L as going to the downstream side. Therefore, the refrigerant flowing from the narrow flow path 1 can be widely spread to the both end portions of the wide flow path 2 in the width direction W along the first surface $5s_1$ and the second surface $5s_2$ of each rectifying piece 5.

In addition, in the embodiment, each rectifying piece 5 further includes the third surface $5s_3$ that is joined to the first surface $5s_1$ and the second surface $5s_2$, and does not contact with the first angle portion $5a_1$, the second angle portion $5a_2$ that is formed by the second surface $5s_2$ and the third surface $5s_3$ joining at the obtuse angle $\theta_2$, and the third angle portion $5a_3$ that is formed by the third surface $5s_3$ and the first surface $5s_1$ joining at the acute angle $\theta_3$. Therefore, the refrigerant flowing from the narrow flow path 1 can flow so as to spread from the center to the ends of the wide flow path 2 in the width direction W along the first surface $5s_1$ of each rectifying piece 5. In addition, the refrigerant flowing from the narrow flow path 1 can flow so as to spread from the second surface $5s_2$ of each rectifying piece 5 to the ends of the wide flow path 2 in the width direction W along the third surface $5s_3$. That is, the laminar flow of the refrigerant is promoted by the rectifying pieces 5 and the refrigerant can be smoothly and easily widely spread in the width direction W of the wide flow path 2.

In addition, in the embodiment, a cross-sectional shape perpendicular to the center axis L of the wide flow path 2 is rectangular and the rectifying piece 5 is provided in a columnar shape in the upstream portion $2a$ of the wide flow path 2. Therefore, the refrigerant flowing from the narrow flow path 1 is divided by the rectifying pieces 5 and can smoothly and widely spread in the width direction W of the wide flow path 2.

Furthermore, in the embodiment, the heating body 30 is in thermal contact with the pipe 11 configuring the wide flow path 2, and the fins 4 are provided in the position X of the wide flow path 2 facing the heating body 30. Therefore, heat generated by the heating body 30 is easily transmitted to the refrigerant flowing through the wide flow path 2 via the fins 4. Therefore, the cooling efficiency can be further improved.

Figure 4A:
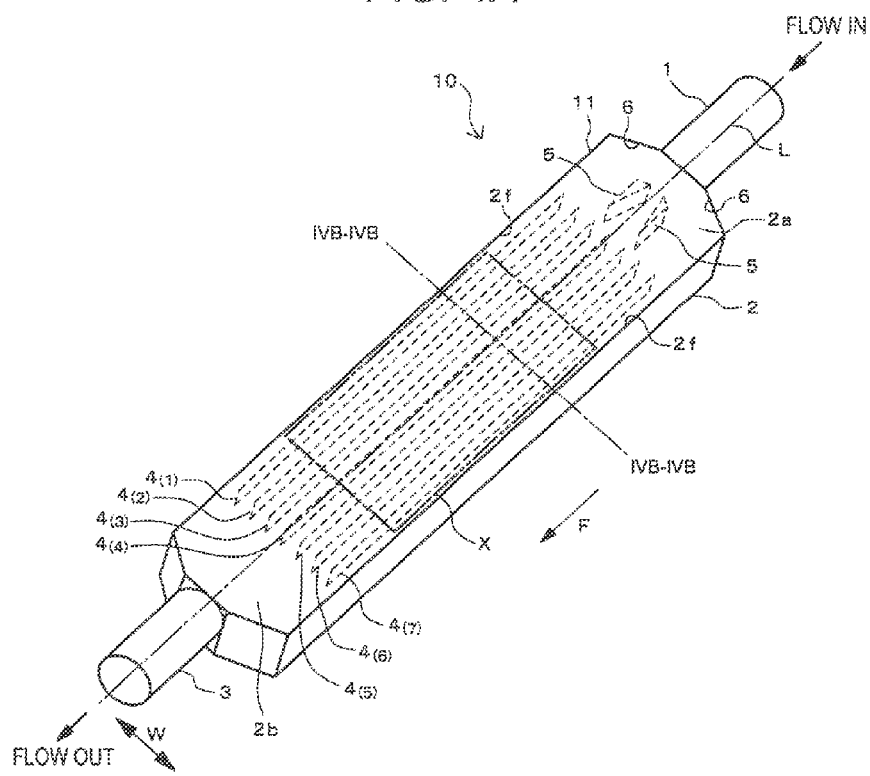
FIGS. 4A and 4B are views illustrating an example of a simulation of the cooler of FIGS. 1A to 1E.
Figure 4B:
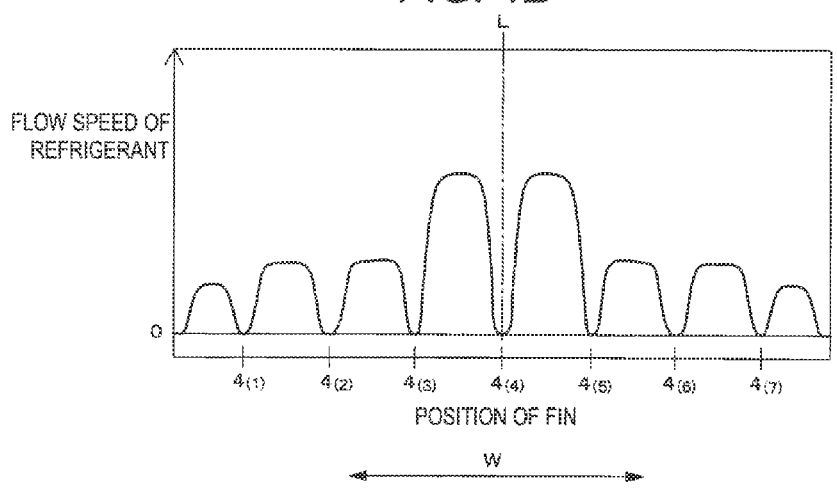
Figure 5A:
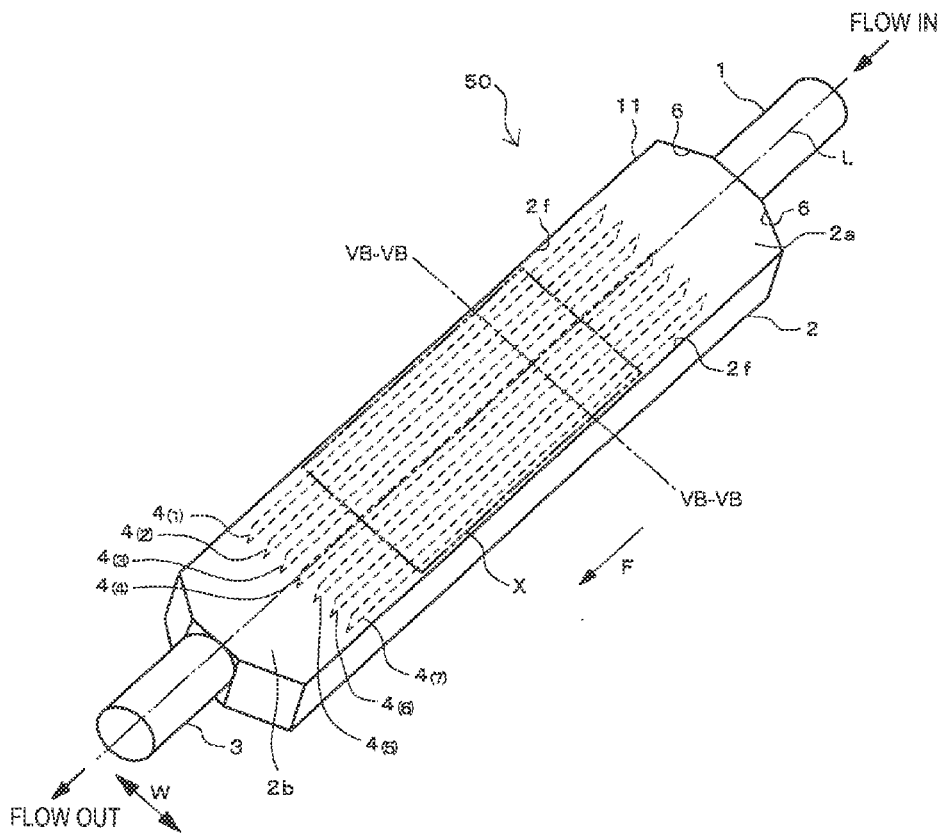
FIGS. 5A and 5B are views illustrating an example of a simulation of a cooler of the related art.
Figure 5B:
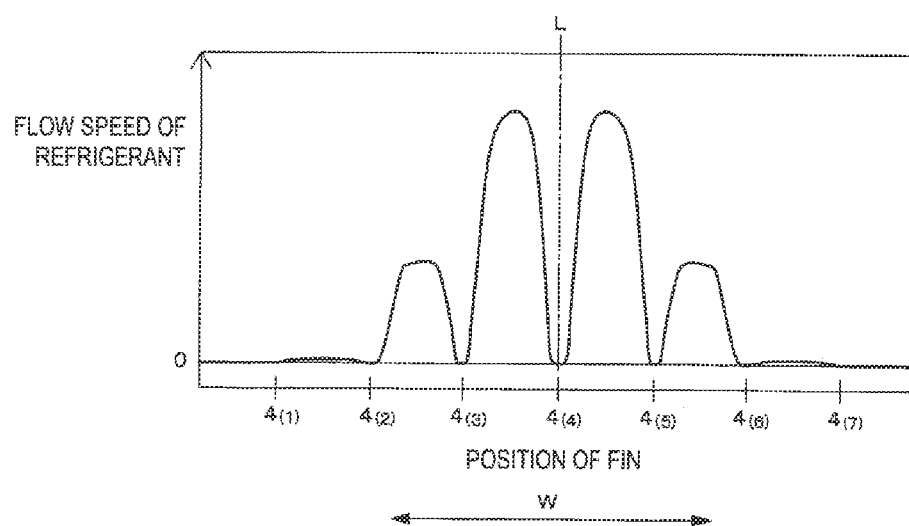

FIGS. 4A and 4B are views illustrating an example of a simulation of the cooler 10. FIGS. 5A and 5B are views illustrating an example of a simulation of a cooler 50 of the related art.

As illustrated in FIG. 5A, the cooler 50 of the related art is not provided with the rectifying pieces 5. Except that, a structure and sizes of the cooler 50 are the same as those of the cooler 10 illustrated in FIG. 4A.

In the examples illustrated in FIGS. 4A and 4B, and 5A and 5B, a diameter of the narrow flow path 1 of the coolers 10 and 50 illustrated in each of FIGS. 4A and 5A is 15 mm. A diameter of the narrow flow path 3 is also 15 mm. A lateral width (size in the width direction W) of the wide flow path 2 is 45 mm. Seven fins $4_{(1)}$ to $4_{(7)}$ are provided at intervals of 5 mm in the width direction W of the wide flow path 2. A thickness of each of the fins $4_{(1)}$ to $4_{(7)}$ in the width direction W is 1 mm. The angle $\theta_c$ of the connecting surface 6 with respect to the center axis L is 600.

An interval between two rectifying pieces 5 of the cooler 10 illustrated in FIG. 4A is 5 mm. An interval between each rectifying piece 5 and the side wall $2f$ of the wide flow path 2 is 16 mm. The angle $\theta_a$ of the first surface $5s_1$ of each rectifying piece 5 with respect to the center axis L illustrated in FIG. 3 is 13°. The angle $\theta_b$ of the second surface $5s_2$ with respect to the center axis L is 60°. An interval between each rectifying piece 5 and the fins $4_{(1)}$ to $4_{(7)}$ in the flow direction F is 4 mm.

As indicated by arrows in FIGS. 4A and 5A, in a case where the refrigerant (cooling water) flows into the narrow flow path 1 of the coolers 10 and 50, and the refrigerant flows out from the narrow flow path 3 through the wide flow path 2, flow speed distributions of the refrigerant at a IVB-IVB cross-section and a VB-VB cross-section are illustrated in FIGS. 4B and 5B, respectively. Since the IVB-IVB cross-section and the VB-VB cross-section are perpendicular to the flow direction F of the refrigerant, the cross-section IVB-IVB and the cross-section VB-VB intersect the position X with which the heating body 30 of the wide flow path 2 of the coolers 10 and 50 is in thermal contact.

In the cooler 50 of the related art in which the rectifying piece 5 is not provided, as illustrated in FIG. 5B, the flow speed of the refrigerant is increased between fins $4_{(2)}$ to $4_{(6)}$ respectively other than fins $4_{(1)}$ and $4_{(7)}$ of both ends of the wide flow path 2. Therefore, the flow speed of the refrigerant is extremely decreased (or to zero) between right and left side walls $2f$ and the fins $4_{(1)}$ and $4_{(7)}$ of the both ends of the wide flow path 2 respectively, between the fins $4_{(1)}$ and $4_{(2)}$ and between the fins $4_{(6)}$ and $4_{(7)}$. That is, in the cooler 50 of the related art, the refrigerant flowing from the narrow flow path 1 flows through the center portion of the wide flow path 2 and hardly flows through the both end portions of the wide flow path 2 in the width direction W.

In contrast, in the cooler 10 in which the rectifying pieces 5 are provided, as illustrated in FIG. 4B, the flow speed of the refrigerant is increased between the fins $4_{(3)}$ to $4_{(5)}$ of the center portion of the wide flow path 2 respectively. While, the flow speed between the fins $4_{(3)}$ to $4_{(5)}$ respectively is suppressed smaller than that between the same portions of the cooler 50 of the related art illustrated in FIG. 5B. Accordingly, the flow speed of the refrigerant is not extremely decreased (or does not become zero) between right and left side walls $2f$ and the fins $4_{(1)}$ and $4_{(7)}$ of the both ends of the wide flow path 2 respectively, between the adjacent fins $4_{(1)}$, $4_{(2)}$, and $4_{(3)}$, and between the adjacent fins $4_{(5)}$, $4_{(6)}$, and $4_{(7)}$ of the cooler 10, and a speed of a certain degree (substantially half of the flow speed between the fins $4_{(3)}$ to $4_{(5)}$ of the center portion respectively) is provided. That is, in the cooler 10, the refrigerant flowing from the narrow flow path 1 flows to the downstream side by widely spreading not only to the center portion of the wide flow path 2 but also to the both end portions of the wide flow path 2 in the width direction W.

One or more embodiments of the invention can adopt various embodiments other than those described above. For example, in the embodiments described above, as illustrated in FIG. 3, an example, in which the rectifying pieces 5 are provided from the inside of the portion (the connecting surface 6) tapering toward the upstream of the wide flow path 2 to the inside of the portion in which the width is constant, is illustrated, but one or more embodiments of the invention are not limited only to the example. In addition, for example, as illustrated in FIG. 6, rectifying pieces 5 may be provided so as to be fitted into an inside (inside of a connecting surface 6) of a portion tapering toward an upstream of a wide flow path 2.

Figure 6:
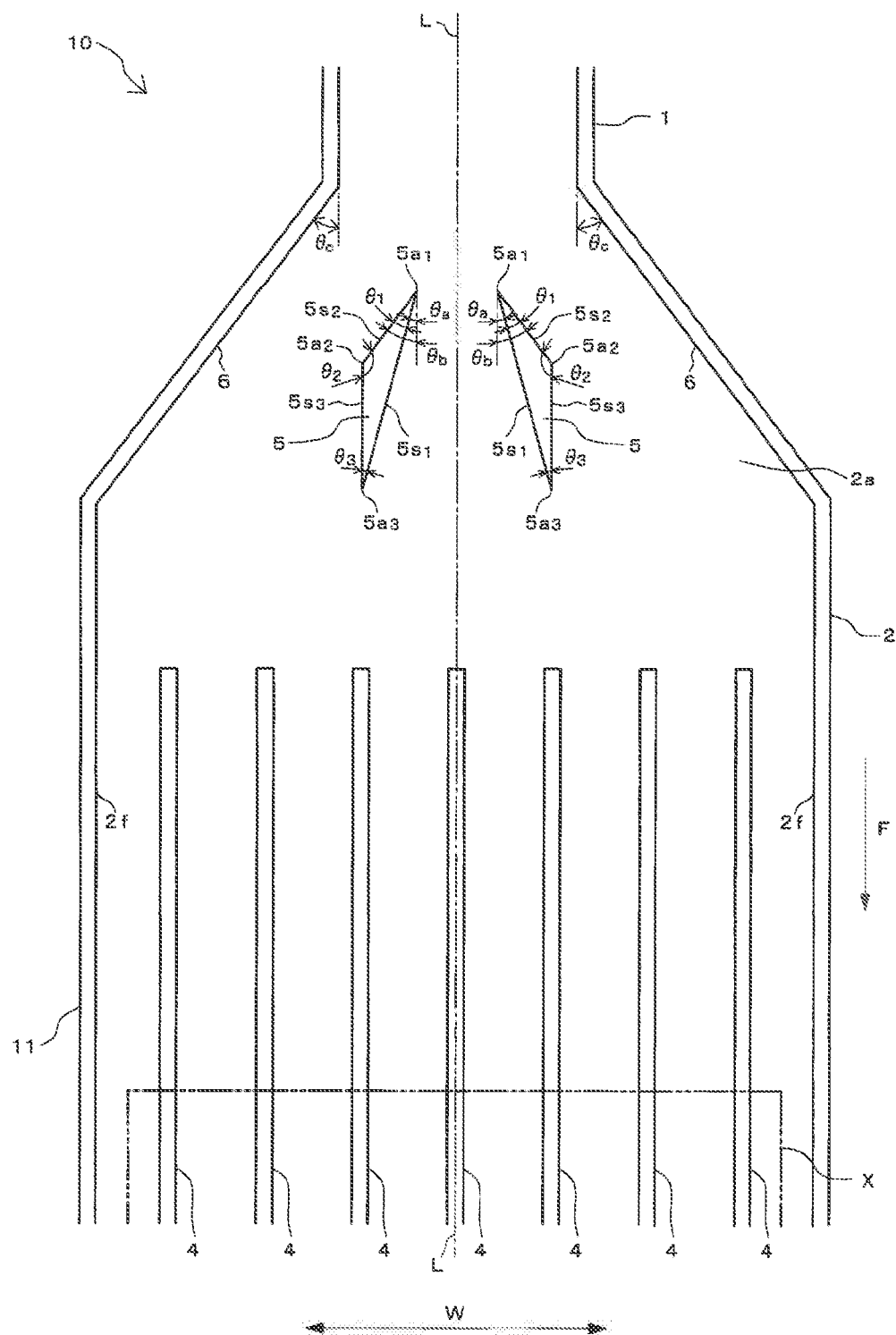
FIG. 6 is a view illustrating a cooler according to another embodiment of the invention.

In FIG. 6, an inclined angle $\theta_c$ of the connecting surface 6 between a narrow flow path 1 and the wide flow path 2 with respect to a center axis L of the wide flow path 2 is smaller than the inclined angle $\theta_c$ of the connecting surface 6 of FIG. 3. In addition, inclined angles $\theta_a$ and $\theta_b$ of a first surface $5s_1$ and a second surface $5s_2$ of a rectifying piece 5 of FIG. 6 are smaller than the inclined angles $\theta_a$ and $\theta_b$ of the first surface $5s_1$ and the second surface $5s_2$ of the rectifying piece 5 of FIG. 3.

Figure 7:
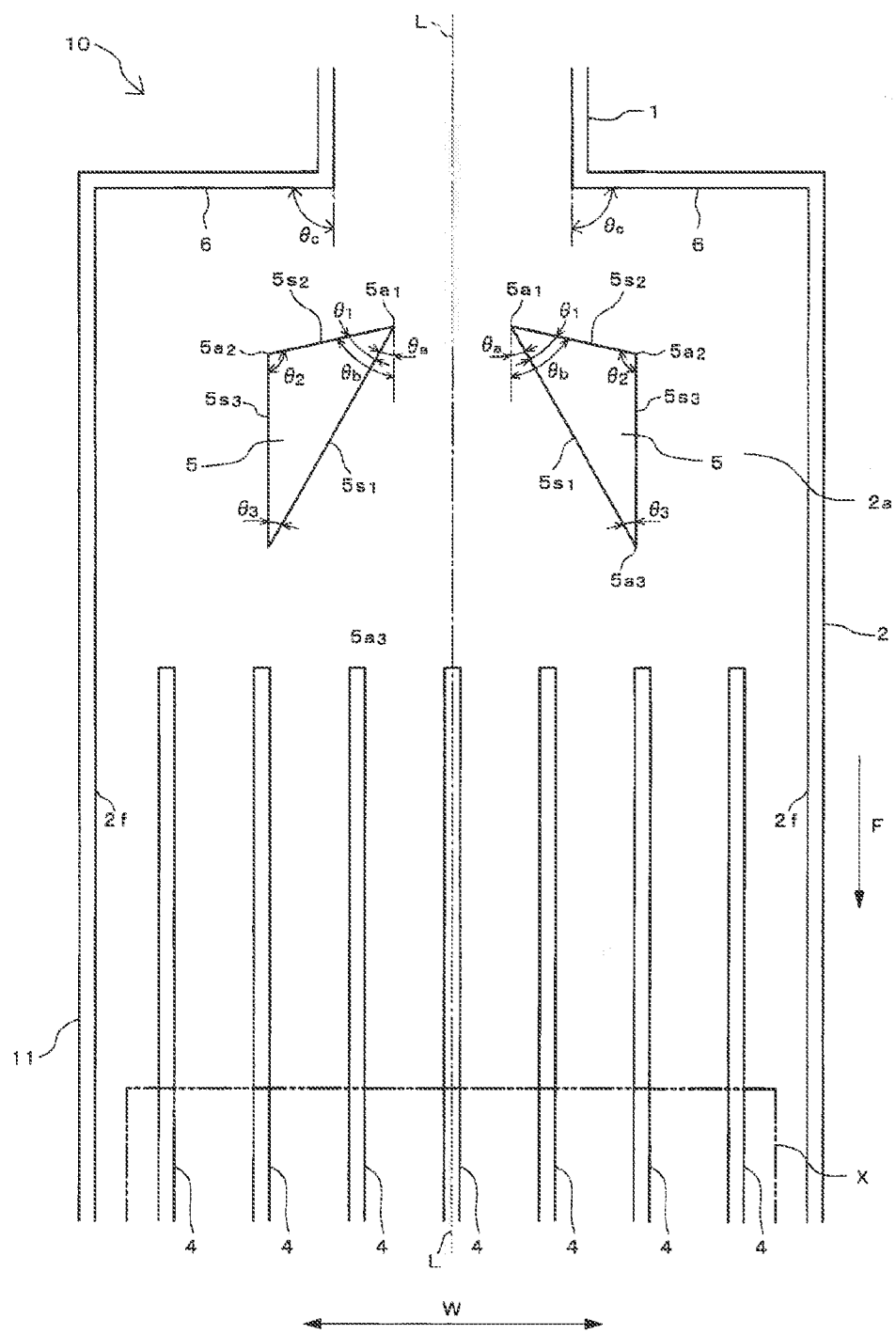
FIG. 7 is a view illustrating a cooler according to further another embodiment of the invention.

In addition, in the embodiments described above, an example, in which the connecting surface 6 between the narrow flow path 1 and the wide flow path 2 is inclined at the acute angle with respect to the center axis L of the wide flow path 2 on a downstream side from the narrow flow path 1, is illustrated, but one or more embodiments of the invention are not limited only to the example. Other than that, for example, as illustrated in FIG. 7, a connecting surface 6 between a narrow flow path 1 and a wide flow path 2 may be perpendicular to a center axis L of the wide flow path 2. That is, an angle $\theta_c$ of the connecting surface 6 with respect to the center axis L of the wide flow path 2 on the downstream side from the narrow flow path 1 is 90° ($\theta_c$=90°). In this case, an angle $\theta_b$ of a second surface $5s_2$ with respect to the center axis L of the wide flow path 2 on the downstream side from a first angle portion $5a_1$ of a rectifying piece 5 is smaller than the angle $\theta_c$ of the connecting surface 6 ($\theta_b<\theta_c$=90°).

Figure 8:
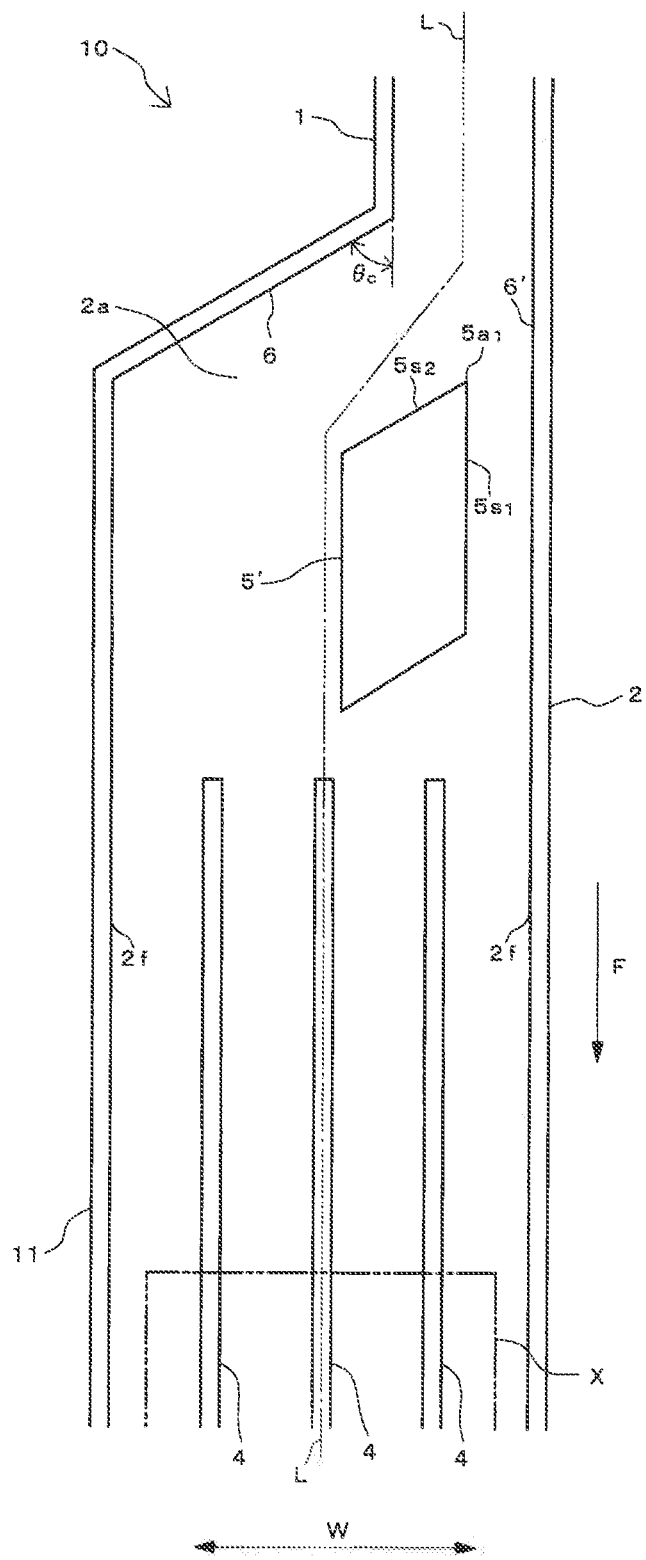
FIG. 8 is a view illustrating a cooler according to further another embodiment of the invention.

In addition, in the embodiments described above, an example, in which the wide flow path 2 and the connecting surface 6 are symmetrically provided with respect to the center axis L of the wide flow path 2, and the plurality of rectifying pieces 5 are symmetrically provided with respect to the center axis L of the wide flow path 2, is illustrated, but one or more embodiments of the invention are not limited only to the example. Other than that, for example, as illustrated in FIG. 8, a connecting surface 6 between a narrow flow path 1 and a wide flow path 2 may not be symmetrically provided with respect to a center axis L of the wide flow path 2. In addition, a single rectifying piece 5 may be provided on an upstream portion $2a$ of the wide flow path 2.

In the example of FIG. 8, a part 6' of the connecting surface 6 is parallel to the center axis L of the flow paths 1 and 2. In addition, a quadrangular prism-shaped rectifying piece 5' is provided in the upstream portion $2a$ of the wide flow path 2. Therefore, a first surface $5s_1$ of the rectifying piece 5' facing the part 6' of the connecting surface 6 is parallel to the center axis L of the wide flow path 2 on a downstream side from the first angle portion $5a_1$ of the rectifying piece 5'. Also in this case, a refrigerant flowing from the narrow flow path 1 can widely spread in a width direction W of the wide flow path 2 through both sides of the rectifying piece 5'.

As described above, an angle $\theta_a$ of the first surface $5s_1$ of the rectifying pieces 5 and 5' with respect to the center axis L of the wide flow path 2 may be 0° or more. In addition, an angle $\theta_b$ of a second surface $5s_2$ of the rectifying pieces 5 and 5' with respect to the center axis L of the wide flow path 2 may be greater than the angle $\theta_a$ of the first surface $5s_1$. In addition, an angle $\theta_c$ of the connecting surfaces 6 and 6' with respect to the center axis L of the wide flow path 2 on the downstream side from the narrow flow path 1 may be the angle $\theta_b$ of the second surface $5s_2$ or more and 90° or less ($0°\leq\theta_a<\theta_b\leq\theta_c\leq 90°$).

In addition, in the embodiments described above, an example, in which the rectifying piece of the triangular prism shape or the quadrangular prism shape is provided in the upstream portion of the wide flow path, is illustrated, but one or more embodiments of the invention are not limited only to the example. Other than that, for example, a rectifying piece such as a polygonal columnar body, or a polygonal pyramidal body may be provided in the upstream portion of the wide flow path. In addition, three rectifying pieces or more may be provided in the upstream side portion of the wide flow path.

Figure 9:
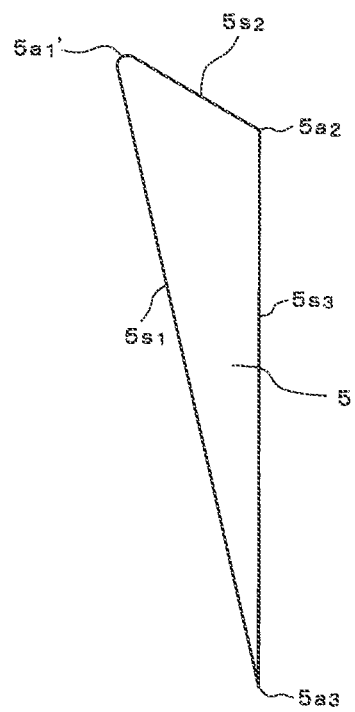
FIG. 9 is a view illustrating a rectifying piece of a cooler according to further another embodiment of the invention.
Figure 10:
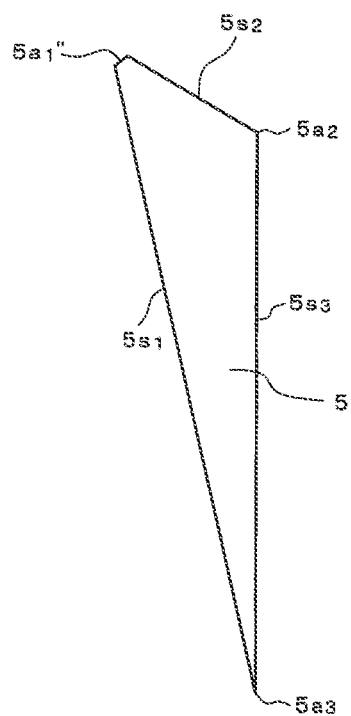
FIG. 10 is a view illustrating rectifying piece of a cooler according to further another embodiment of the invention.

In addition, in the embodiments described above, an example, in which the first angle portions $5a_1$ of the rectifying pieces 5 and 5' are sharp, is illustrated, but one or more embodiments of the invention are not limited only to the example. Other than that, for example, as illustrated in FIG. 9, a first angle portion $5a_1'$ of a rectifying piece 5 may be processed (so-called R-shaped machining) so as to be rounded in an arc shape, or as illustrated in FIG. 10, a first angle portion $5a_1''$ of a rectifying piece 5 may be processed (so-called C-shaped machining) so as to be chamfered on a straight line. In addition, other corner portions of the rectifying piece 5 may be processed not only to be sharp but also to be rounded or chamfered.

In addition, in the embodiments described above, an example (FIGS. 1D and 1E), in which the rectifying pieces 5 and 5', or the fins 4 are provided so as to contact with the top surface and the bottom surface of the wide flow path 2, is illustrated, but one or more embodiments of the invention are not limited only to the example. Other than that, for example, as illustrated in FIGS. 11A and 11B, rectifying pieces 5" and fins 4" having a rib shape may be provided so as to contact with a surface (top surface) of a wide flow path 2" on a heating body 30 side, but to have a gap with respect to a surface (bottom surface) of the wide flow path 2" on a side opposite to a heating body 30.

Figure 11A:
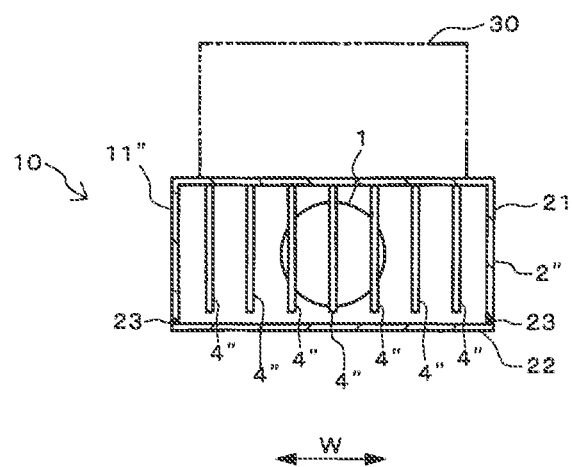
FIGS. 11A and 11B are cross-sectional views illustrating a cooler according to further another embodiment of the invention.
Figure 11B:
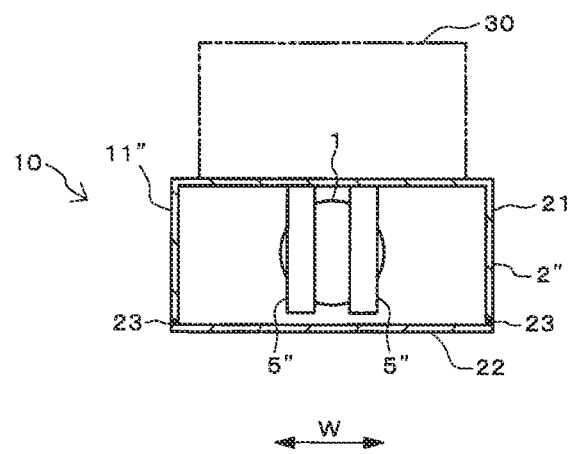

In the example of FIGS. 11A and 11B, a pipe 11" forming the wide flow path 2" is configured of a body 21 having a reverse-recessed cross-sectional shape and a lid 22 that covers an opening portion of the body 21. The pipe 11" is assembled by engaging the lid 22 with a lower portion of the body 21. Sealing is applied to an engaging portion between the body 21 and the lid 22 by a seal member 23. A heating body 30 is in thermal contact with an upper portion of the body on a side opposite to the lid 22 of the body 21. The rectifying pieces 5" and the fins 4" having the rib shape are provided downward from an upper portion of the body 21. Fine gaps are generated between lower surfaces (tips) of the rectifying pieces 5" and the fins 4", and the lid 22. That is, the rectifying pieces 5" and the fins 4" are provided on a heating body 30 side of the wide flow path 2". Moreover, as another example, sealing may also be applied between the lower surfaces of the rectifying pieces 5" and the fins 4", and the lid 22.

In addition, in the embodiments described above, an example, in which the cross-sectional shape perpendicular to the center axis L of the wide flow path 2 is rectangular, is illustrated, but one or more embodiments of the invention are not limited only to the example. Other than that, for example, the cross-sectional shape perpendicular to the center axis of the wide flow path may be circular, elliptical, or other angular shapes. In addition, the cross-sectional shape perpendicular to the center axis of the narrow flow path may be rectangular, elliptical, or other angular shapes.

Furthermore, in the embodiments described above, an example, in which one or more embodiments of the invention are applied to the cooler 10 that is embedded in the chassis 20 of the electronic device and cools the heating body 30 mounted on the chassis 20, is cited. While, for example, one or more embodiments of the invention can also be applied to a cooler that is attached to, for example, a frame, or a housing, and is mounted on a substrate or the like. In addition, one or more embodiments of the invention can also be applied to a flow path unit for using other than cooling in which a fluid other than the refrigerant flows from a narrow flow path to the wide flow path.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

The invention claimed is:
1. A cooler comprising:
a narrow flow path that has a predetermined cross-sectional area;
a wide flow path that is connected to the narrow flow path, is in thermal contact with a heating body, and has a cross-sectional area greater than that of the narrow flow path;
at least one rectifying piece that is provided in an upstream portion of the wide flow path that is closer to the narrow flow path than a position being in thermal contact with the heating body,
wherein a fluid refrigerant flows through the narrow flow path and the wide flow path, and heat generated by the heating body is radiated, and
wherein the at least one rectifying piece comprises:
a single first angle portion that protrudes toward the narrow flow path; and
a first surface and a second surface that join at an acute angle to form the first angle portion; and
a connecting surface that connects the narrow flow path and the wide flow path,
wherein the connecting surface is inclined at an acute angle or perpendicular to a center axis of the wide flow path on a side connected to the narrow flow path,
wherein an angle of the second surface with respect to the center axis of the wide flow path from the first angle portion of the at least one rectifying piece is equal to or less than an angle of the connecting surface with respect to the center axis of the wide flow path on the side connected to the narrow flow path,
wherein the narrow flow path, the wide flow path and the connecting surface are symmetrically provided with respect to a center axis of the narrow flow path and the center axis of wide flow path,
wherein a plurality of the at least one rectifying pieces are provided symmetrically and at predetermined intervals with respect to the center axis of the narrow flow path and the center axis of wide flow path,
wherein the first surface and the second surface of each piece of the plurality of the at least one rectifying pieces are inclined so as to separate from the center axis of the wide flow path, and
wherein each piece of the plurality of the at least one rectifying pieces further comprises:
a third surface that is joined to the first surface and the second surface, and does not contact with the first angle portion,
a second angle portion that is formed by the second surface and the third surface which join at an obtuse angle, and
a third angle portion that is formed by the third surface and the first surface which join at an acute angle.
2. The cooler according to claim 1,
wherein the second surface of the at least one rectifying piece is disposed on a broadening direction side of the wide flow path with respect to the narrow flow path from the first surface, and
wherein on a downstream side from the first angle portion, the first surface is inclined at an acute angle or parallel to the center axis of the wide flow path,
the second surface is inclined at an acute angle with respect to the center axis of the wide flow path, and
an angle of the second surface with respect to the center axis of the wide flow path is greater than an angle of the first surface with respect to the center axis of the wide flow path.
3. The cooler according to claim 1,
wherein a cross-sectional shape perpendicular to the center axis of the wide flow path is rectangular, and
wherein each piece of the plurality of the at least one rectifying pieces is provided to have a columnar shape in the upstream portion of the wide flow path.
4. The cooler according to claim 1, further comprising:
at least one fin that is provided in a position of the wide flow path facing the heating body.
5. A flow path unit comprising:
wherein a fluid flows from a narrow flow path to a wide flow path;
wherein the narrow flow path that has a narrow predetermined cross-sectional area;
a wide flow path that is connected to a downstream side of the narrow flow path and has a cross-sectional area greater than that of the narrow flow path;
at least one rectifying piece that is provided in an upstream portion of the wide flow path;
at least one fin that is provided on a downstream side from the rectifying piece of the wide flow path, and wherein the at least one rectifying piece comprises:
a single first angle portion that protrudes toward the narrow flow path; and
a first surface and a second surface that join at an acute angle to form the first angle portion; and
a connecting surface that connects the narrow flow path and the wide flow path,
wherein the connecting surface is inclined at an acute angle or perpendicular to a center axis of the wide flow path on the downstream side of the narrow flow path,
wherein an angle of the second surface with respect to the center axis of the wide flow path from the first angle portion of the rectifying piece is equal to or less than an angle of the connecting surface with respect to the center axis of the wide flow path on the side connected to the narrow flow path,
wherein the narrow flow path, the wide flow path and the connecting surface are symmetrically provided with respect to a center axis of the narrow flow path and the center axis of wide flow path,
wherein a plurality of the at least one rectifying pieces are provided symmetrically and at predetermined intervals with respect to the center axis of the narrow flow path and the center axis of wide flow path,
wherein the first surface and the second surface of each piece of the plurality of the at least one rectifying pieces are inclined so as to separate from the center axis of the wide flow path, and
wherein each piece of the plurality of the at least one rectifying pieces further comprises:
a third surface that is joined to the first surface and the second surface, and does not contact with the first angle portion,
a second angle portion that is formed by the second surface and the third surface which join at an obtuse angle, and
a third angle portion that is formed by the third surface and the first surface which join at an acute angle.

* * * * *